United States Patent [19]

Takahashi et al.

[11] Patent Number: 4,810,961

[45] Date of Patent: Mar. 7, 1989

[54] RADIO WAVE LEAKAGE DIAGNOSING SYSTEM FOR INTELLIGENT BUILDING

[75] Inventors: Takeshi Takahashi; Masatake Nakamura; Yoshiji Yabana; Toshiyuki Ishikawa; Koji Nagata, all of Kyobashi, Japan

[73] Assignee: Shimizu Construction Co., Ltd., Tokyo, Japan

[21] Appl. No.: 195,052

[22] Filed: May 17, 1988

[51] Int. Cl.$^4$ ............................................. G01R 23/00
[52] U.S. Cl. ...................................... 324/95; 455/67; 324/520
[58] Field of Search .................. 324/95, 520; 343/703; 455/67, 226, 115; 340/600; 174/35 MS

[56] References Cited

U.S. PATENT DOCUMENTS

| 3,531,577 | 9/1970 | Garlington et al. | 174/35 MS |
| 4,072,899 | 2/1978 | Shimp | 324/95 |
| 4,631,473 | 12/1986 | Honda | 324/95 |

FOREIGN PATENT DOCUMENTS 5547743  4/1980  Japan .

Primary Examiner—Reinhard J. Eisenzopf
Assistant Examiner—Anthony L. Miele
Attorney, Agent, or Firm—Armstrong, Nikaido, Marmelstein & Kubovcik

[57] ABSTRACT

Disclosed is a radio wave leakage diagnosing system for use in an intelligent building which is constructed using an electromagnetic shielding material for the skeleton and openings such as windows and doorways so that the whole of the building is formed into an electromagnetic shielding structure. The system has a radio wave detector disposed outside the building for detecting a predetermined radio wave transmitted from each floor of the building, so that a floor, togethere with a specific position, where there is a leakage of radio wave is detected on the basis of the intensity of the detected radio wave. With this arrangement, a predetermined radio wave is transmitted from each floor of the building and the transmitted radio wave is detected by the radio wave detector. Accordingly, the degree at which the radio wave leaks from each floor can be checked on the basis of the intensity of the received radio wave, and when the electromagnetic shielding is broken, the floor and specific position where the shielding abnormality occurs can be found on the basis of the intensity of the received radio wave. When the electromagnetic shielding performance has deteriorated, it is possible to know the degree of deterioration by making a comparison with the diagnostic results obtained in the past.

3 Claims, 2 Drawing Sheets

RADIO WAVE LEAKAGE DIAGNOSING SYSTEM FOR INTELLIGENT BUILDING

BACKGROUND OF THE INVENTION

The present invention relates to a radio wave leakage diagnosing system for an intelligent building which is constructed using an electromagnetic shielding material for the skeleton and openings such as windows and doorways so that the whole of the building is formed into an electromagnetic shielding structure.

It is general practice in intelligent buildings to utilize jointly information communicating equipment such as a composite electronic switching system, a computer, etc. for information communication with the other party inside or outside the building. As a result of an increase in value placed on information and diversification as well as individualization of need for information, there is a rapid increase in the amount of information handled. Under these circumstances, it is a problem for future intelligent buildings how to provide required information quickly at low cost. To solve this problem, there has been studied and proposed an information network adopting a data highway system that utilizes optical fiber cables, coaxial cables or the like.

However, the data highway system of the type described above needs to lay optical fiber cables or coaxial cables extend to every terminal equipment, and therefore it necessitates a floor duct and a double-floored structure for laying such cables, resulting in a considerable increase in both the cost of construction and the term of works.

If radio waves are used for information communication, no cables are needed. In such a case, however, since the radio waves may induce noises outside the intelligent building, the use of radio waves comes under the control of radio law; on the other hand, external radio waves may cause malfunction of the system.

Accordingly, the applicant of this invention has already made various propositions concerning an intelligent building which is constructed using an electromagnetic shielding material for the skeleton and openings such as windows and doorways so that the whole of the building is formed into an electromagnetic shielding structure, thereby enabling radio communication inside the building at any desired frequency without suffering from regulation by radio law.

However, even if the whole of the building is constructed as being an electromagnetic shielding structure to enable radio communication inside the building, once the electromagnetic shielding is broken at any part of the building, the radio wave which is used inside the building is released to the outside; in such a case, the released radio wave may be undesirably detected, resulting in leakage of classified information, or the released radio wave may be a disturbing wave. Further, external radio waves such as broadcast and telecast waves may intrude into the building to cause noises. Therefore, if the electromagnetic shielding is broken, it becomes impossible to effect the radio communication inside the building, resulting in a paralysis of the information transmitting function. Accordingly, it is considerably important in order to avoid such problems to find a defect or deterioration of the electromagnetic shielding in its early stage. However, it is not easy to predict a position where the electromagnetic shielding of an intelligent building will probably be broken. In particular, when the size of the building itself increases the of inspection enlarges correspondingly. For this reason, it is considered difficult to make a diagnosis as to whether or not electromagnetic shielding performance is satisfactory, and there has heretofore been no system which is capable of finding a defect or deterioration of electromagnetic shielding of intelligent buildings.

SUMMARY OF THE INVENTION

It is a primary object of the present invention to provide a radio wave leakage diagnosing system which is capable of readily finding deterioration of the electromagnetic shielding performance of an intelligent building and a defect in an electromagnetic shielding structure.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

To attain the above-described object, the present invention provides a radio wave leakage diagnosing system for use in an intelligent building which is constructed using an electromagnetic shielding material for the skeleton and openings such as windows and doorways so that the whole of the building is formed into an electromagnetic shielding structure, the system comprising radio wave detecting means disposed outside the building for detecting a predetermined radio wave transmitted from each floor of the building, whereby a floor, together with a specific position, where there is a leakage of radio wave is detected on the basis of the intensity of the detected radio wave.

In the radio wave leakage diagnosing system for an intelligent building according to the present invention, a predetermined radio wave is transmitted from each floor of the building and the transmitted radio wave is detected by the radio wave detecting means. Accordingly, the degree at which the radio wave leaks from each floor can be checked on the basis of the intensity of the received radio wave, and when the electromagnetic shielding is broken, the floor and specific position where the shielding abnormality occurs can be found on the basis of the intensity of the received radio wave. When the electromagnetic shielding performance has deteriorated, it is possible to know the degree of deterioration by making a comparison with the diagnostic results obtained in the past.

DESCRIPTION OF PREFERRED EMBODIMENTS

One embodiment of the present invention will be described hereinunder with reference to the accompanying drawings.

Figure 1:
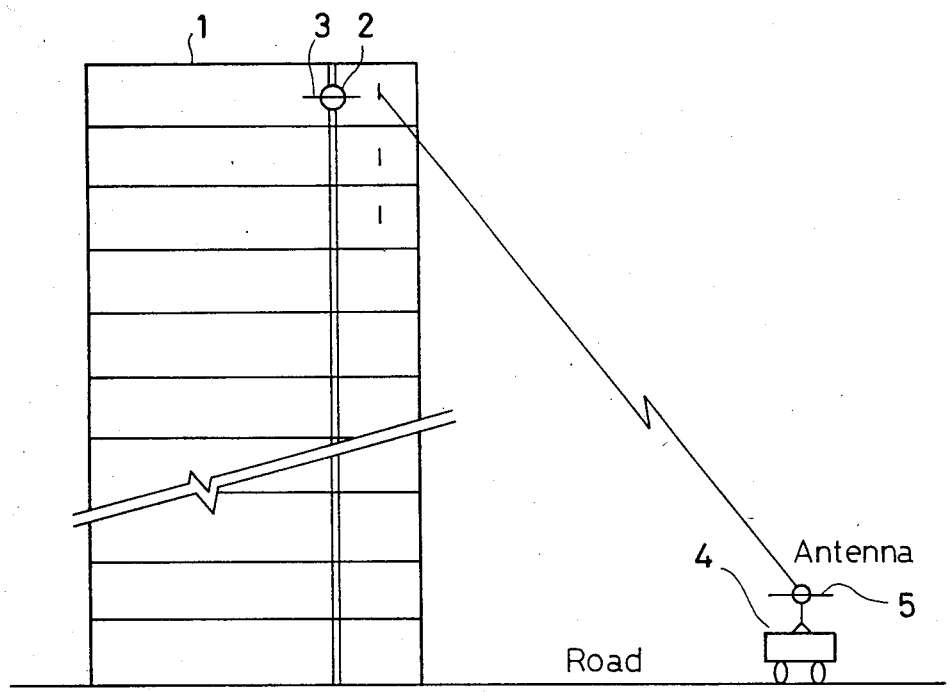
FIG. 1 shows one embodiment of the radio wave leakage diagnosing system for an intelligent building according to the present invention.

Referring to FIG. 1, the reference numeral 1 denotes a building, 2, 4 radio wave leakage detectors, 3, 5 antennas, 11 a transmitter, 12 a receiving section, 13 an amplifying section, 14 a processing section, 15 a memory section, 16 a print output section, and 17 a display output section.

Figure 2:
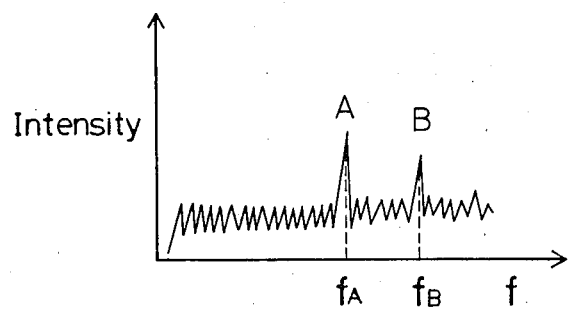
FIG. 2 is a graph employed to describe the radio wave leakage detecting signal.
Figure 3:
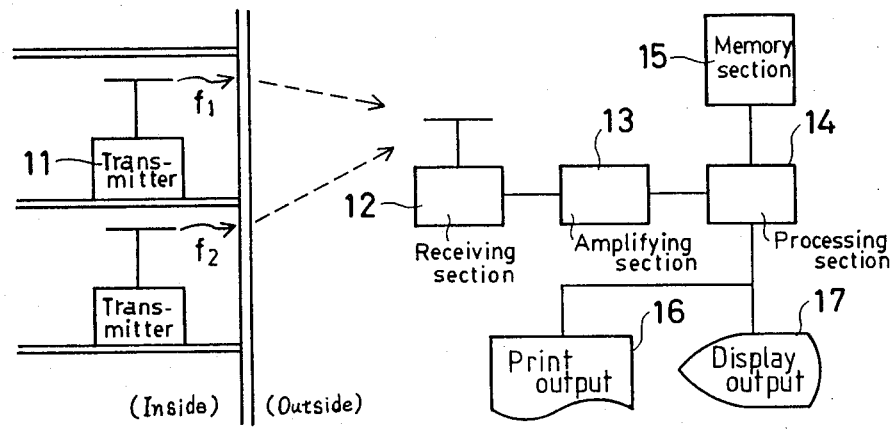
FIG. 3 shows one example of the arrangement of the radio wave leakage detector disposed on the ground.

The radio wave leakage detector 2 is mounted on, for example, a gondola which moves along the outer walls of the floors of the building 1. The detector 2 has an antenna 3 to detect a radio wave leaking out from the building 1. The radio wave leakage detector 4 is disposed at an appropriate position on the ground where it is able to detect a radio wave leaking out from any of the floors. The detector 4 also has an antenna 5 to detect a leakage radio wave. The radio wave leakage diagnosing system according to the present invention comprises the above-described two radio wave leakage detectors 2 and 4. First, a radio wave which is transmitted from each floor of the building 1 is detected with the radio wave leakage detector 4 to obtain data concerning the intensity of the received wave, for example, intensity data such as that shown in FIG. 2, thus identifying a floor having an abnormal radio wave leakage on the basis of the received wave intensity data. Then, a radio wave leakage position on the identified floor is detected using the radio wave leakage detector 2. FIG. 3 shows one example of the arrangement of the radio wave leakage detector 4 which is disposed on the ground.

As shown in FIG. 3, in the radio wave leakage detector disposed on the ground, a radio wave which is transmitted from each of the transmitters 11 installed inside the building is detected by a receiving section 12 having an antenna. The detected signal is amplified in an amplifying section 13 and then processed in a processing section 14. The processing section 14 identifies received signal data from each floor of the building and stores the identified data in a memory section 15. The processing section 14 further outputs the obtained data from a print output section 16 and a display output section 17 in the form of a graph such as that shown in FIG. 2. The arrangement may be such that data for diagnosis, for example, a reference value used to judge the level of a received wave and a threshold value for judgement of a radio wave leakage, are stored in the memory section 15 in advance and these data items are output in such a manner as to be superposed on the graph, or the degree of leakage of a radio wave at each floor is automatically diagnosed and the result of the diagnosis is stored and output.

The diagnostic procedure carried out by the radio wave leakage diagnosing system for an intelligent building according to the present invention will be briefly explained hereinunder.

First, a radio wave having a frequency which is in the vicinity of the frequency of a radio wave used indoors is transmitted from the transmitter 11 disposed on each floor. The radio wave leakage detector 4 checks the intensity of each radio wave received to detect a floor having a radio wave leakage on the basis of the received wave intensity. For example, as shown in FIG. 2, a radio wave transmitted from a floor having no radio wave leakage has an intensity which is lower than a predetermined value, whereas radio waves from floors having a radio wave leakage have relatively high intensities as shown by the reference symbols A and B. Accordingly, it is possible to identify a floor having a radio wave leakage by a frequency having a relatively high intensity. Next, the radio wave leakage detector 2 is moved around the identified floor to check the intensity of a received radio wave having a frequency used in the floor concerned, and a radio wave leakage position is detected on the basis of the intensity level of the received wave.

There may be various ways of assigning frequencies to the respective floors of an intelligent building depending upon the structure of the building. The applicant of this invention has already proposed a system in which an electromagnetic shielding space in an intelligent building having its outer wall surface covered with an electromagnetic shielding layer is divided into electromagnetic shielding regions corresponding to the respective floors of the building and a desired service frequency band is assigned to each floor to enable radio communication inside the building [see Japanese Patent Application No. 61-73051 (1986)]. The proposed arrangement enables the same service frequency band to be assigned to all the floors. In this case, assuming that the number of channels for each floor is n and the frequency band width for 1 channel is 25 kHz, it suffices to install, on each floor, communication equipment designed for a frequency band of 25 kHz x n In other words, it is only necessary for an m-story building to prepare m sets of communication equipment of the same kind. Therefore, it is possible to reduce the installation cost.

Figure 4:
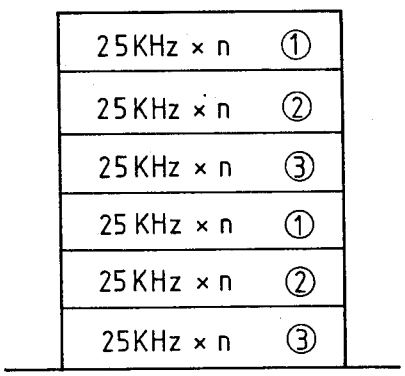
FIG. 4 show one example of assignment of frequencies used in communication inside an intelligent building.

However, in the case where there is a radio wave leakage because of unsatisfactory electromagnetic shielding between a pair of adjacent floors, the communication equipment installed on each of the floors may be caused to malfunction by the radio wave leaking out from the adjacent floor. In order to solve such a problem, service frequency bands for a pair of adjacent floors are made different from each other. One example of the arrangement is shown in FIG. 4. In this example, three different kinds of frequency bands ①, ② and ③ are set, each frequency band having a width of 25 kHz x n, and these frequency bands are assigned to the respective floors of the building in such a manner that the set of frequency bands ①, ② and ③ is repeatedly assigned to the floors from the top to the bottom, or vice versa. With this arrangement, since the service frequency bands which are respectively assigned to each pair of adjacent floors are different from each other, even if there is a little radio wave leakage between a pair of adjacent floors, no radio interference occurs and therefore no malfunction of the communication equipment occurs. In this case, it suffices to prepare three different kinds of communication equipment each designed for a frequency band of 25 kHz x n and to dispose them in such a manner that the frequency bands for each pair of adjacent floors are different from each other. It should be noted that, since different frequency bands are used at each pair of adjacent floors, it is basically sufficient to assign two different frequency bands alternately to the floors.

In the case where the same frequency is used at every floor and the same frequency is used for radio waves transmitted for diagnosis of a radio wave leakage as in the foregoing embodiment, a radio wave having a predetermined frequency is transmitted successively from the floors with a time lag. On the other hand, the radio wave leakage detector 4 checks the intensity of a received signal having the predetermined frequency on the time base. More specifically, as will be clear from the graph of FIG. 2 in which the axis of abscissas represents the time base, it is possible to identify a floor having a radio wave leakage on the basis of the time when the intensity of the received wave increases, as shown by the reference symbols A and B. As the electromagnetic shielding performance becomes deteriorated, the average intensity of the received wave on the graph of FIG. 2 rises gradually. Therefore, it is possible to readily know the degree of deterioration of the electromagnetic shielding performance at each floor by comparison with the diagnostic results obtained in the past.

It should be noted that the present invention is not necessarily limited to the above-described embodiment and various changes and modifications may be imparted thereto. For example, the radio wave leakage detector for detecting a radio wave leakage at each floor in the foregoing embodiment may be mounted on a cleaning robot which is generally used to clean the outer walls of buildings. In such a case, the arrangement may be such that leakage of a radio wave at each floor is automatically inspected during cleaning and the movement of the robot is controlled on the basis of time such that, when the level of a received wave is high, the movement of the robot is slowed down to make a closer inspection. Thus, it is unnecessary to use the radio wave leakage detector disposed on the ground and it is therefore possible to effect detection of a radio wave leakage even more efficiently with a reduced number of measuring operations. The arrangement may also be such that the radio wave leakage detector mounted on the gondola is provided with a wire or wireless transmitting means to transmit results of measurement to the radio wave leakage detector on the ground so as to display the measurement results on the display screen on the ground. In the case where the whole of a building is constructed as being an electromagnetic shielding structure by using an electromagnetic shielding material for the skeleton and openings such as windows and doorways but the floors are not electromagnetically shielded from each other, the arrangement may be such that radio waves of the same frequency are transmitted from the respective floors at different times and a floor, together with a specific position, where a radio wave leaks is identified on the basis of the intensity difference between the received radio waves.

As will be clear from the foregoing description, according to the present invention, the radio wave leakage detector which is moved along the outer wall of each floor can also be mounted on a cleaning robot. Therefore, it is possible to make a diagnosis of a radio wave leakage in an intelligent building at relatively low cost and with a high degree of accuracy. Combination of a radio wave leakage detector disposed on the ground and a radio wave leakage detector mounted on a gondola enables diagnosis to be carried out in two stages, i.e., coarse and fine diagnoses, and therefore permits an increase in both the efficiency and accuracy in diagnosis.

What we claim is:

1. A radio wave leakage diagnosing system for use in an intelligent building which is constructed using an electromagnetic shielding material for the skeleton and openings such as windows and doorways so that the whole of the building is formed into an electromagnetic shielding structure, said system comprising:
   radio wave detecting means disposed outside said building for detecting a predetermined radio wave transmitted from each floor of said building,
   whereby a floor, together with a specific position, where there is a leakage of radio wave is detected on the basis of the intensity of the detected radio wave, wherein radio waves having different frequencies are transmitted from the respective floors each floor having a distinct radio wave frequency and being electromagnetically shielded from each other to make a diagnosis.

2. A radio wave leakage diagnosing system for use in an intelligent building which is constructed using an electromagnetic shielding material for the skeleton and openings such as windows and doorways so that the whole of the building is formed into an electromagnetic shielding structure, said system comprising:
   radio wave detecting means disposed outside said building for detecting a predetermined radio wave transmitted from each floor of said building,
   whereby a floor, together with a specific position, where there is a leakage of radio wave is detected on the basis of the intensity of the detected radio wave wherein radio waves having the same frequency are transmitted from the respective floors, which are electromagnetically shielded from each other, at different times, respectively, to make a diagnosis.

3. A radio wave leakage diagnosing system according to claim 1 or 2, wherein said radio wave detecting means comprises a first radio wave detecting means disposed at a predetermined position outside said building to detect a radio wave transmitted from each floor and a second radio wave detecting means moved along the wall surface of each floor of said building to detect a radio wave transmitted from the floor.

* * * * *